United States Patent [19]

Bigelow

[11] 4,158,216

[45] Jun. 12, 1979

[54] CAPACITIVE TOUCH CONTROL

[75] Inventor: John E. Bigelow, Clifton Park, N.Y.

[73] Assignee: General Electric Company, Schenectady, N.Y.

[21] Appl. No.: 879,368

[22] Filed: Feb. 21, 1978

[51] Int. Cl.² ............................................. H01G 5/04
[52] U.S. Cl. .............................. 361/280; 200/DIG. 1; 361/292; 361/300
[58] Field of Search ............... 361/287, 300, 292, 280, 361/281; 340/365 C; 200/DIG. 1, 52 R

[56] References Cited

U.S. PATENT DOCUMENTS

| | | | |
|---|---|---|---|
| 4,089,817 | 5/1978 | Kirkendall | 361/292 X |
| 4,090,092 | 5/1978 | Serrano | 200/DIG. 1 X |

Primary Examiner—E. A. Goldberg
Attorney, Agent, or Firm—Geoffrey H. Krauss; Joseph T. Cohen; Marvin Snyder

[57] ABSTRACT

A control for use upon a solid panel, devoid of control shaft apertures, allows data entry by rotational positioning of an electrode to vary the capacitance to at least one of a multiplicity of electrodes formed upon an interior surface of the panel. A magnetizable disk is attached to the exterior of the panel, with the control knob having a magnetized member attracted to the disk for maintaining the control knob in proper position while allowing control knob rotational adjustments. A light-emitting display is positioned behind the panel to indicate the index of the control knob by means of a variable-length, circular bar of light.

9 Claims, 5 Drawing Figures

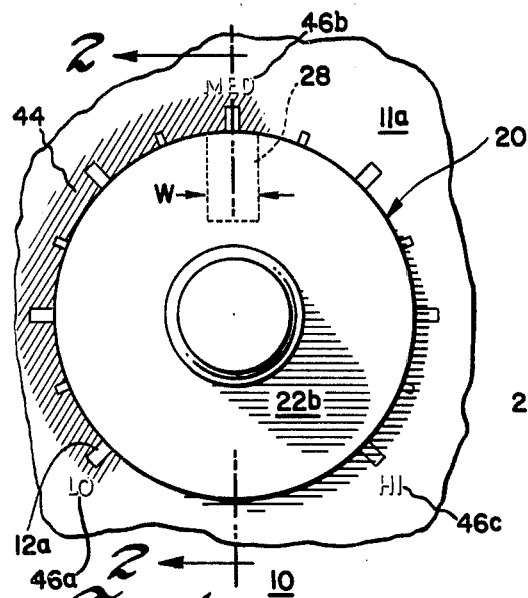
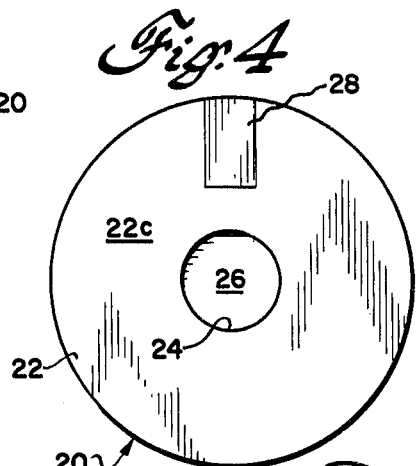
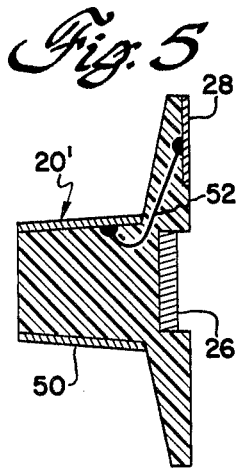
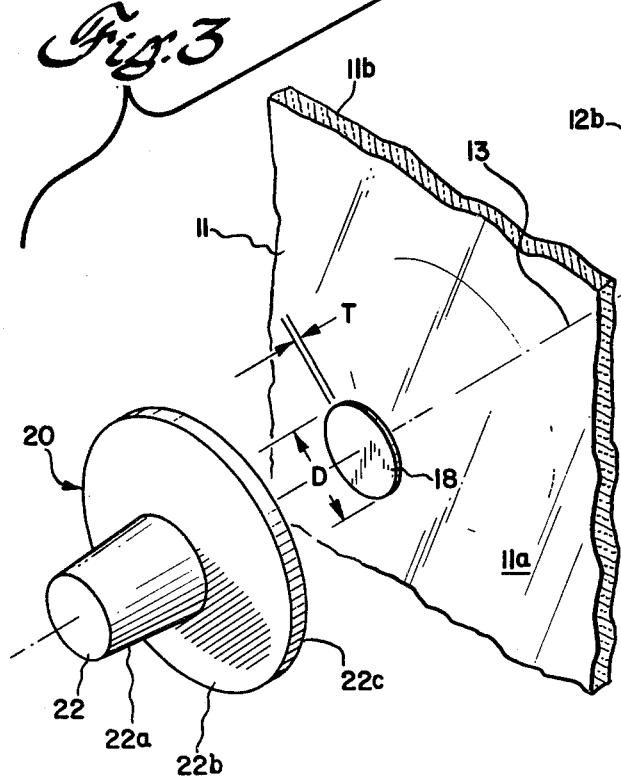
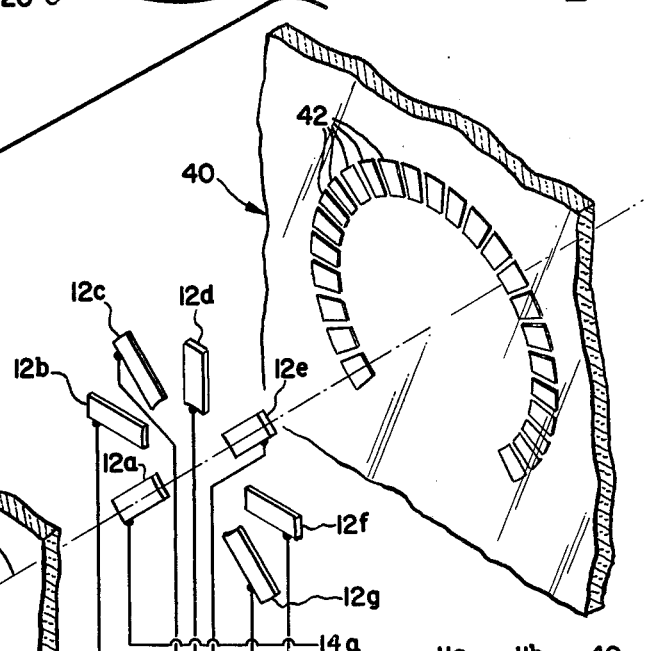
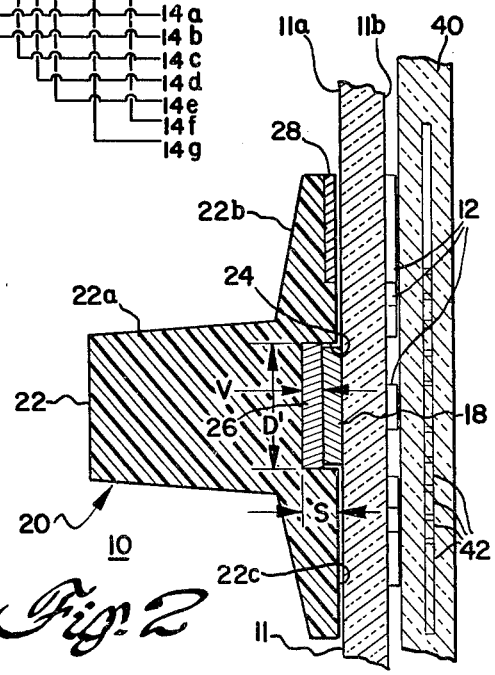

CAPACITIVE TOUCH CONTROL

BACKGROUND OF THE INVENTION

The present invention is directed toward control system data entry apparatus and, more particularly, to a novel capacitive touch entry control which can be fabricated upon a solid panel without the need for forming openings through the panel.

It has been found desirable to use capacitive touch entry controls in the electronic control systems of many types of apparatus, and particularly with home appliances. Such capacitive touch entry controls have the advantage of relatively low cost and ease of fabrication, but have the disadvantage of requiring a relatively large panel area if a fine analog setting must be provided. Accordingly, a capacitive touch entry control facilitating a fine degree of manual control is desirable.

BRIEF SUMMARY OF THE INVENTION

In accordance with the invention, a capacitive touch control, capable of fabrication upon an un-apertured insulative panel, utilizes a multiplicity of input electrodes, each forming one side of a like multiplicity of capacitive input receptors, arranged about the major portion of the circumference of a circle. The input electrodes are fabricated upon the surface of the panel facing the interior of the equipment. A disk is attached to the remaining (exterior-facing) surface of the panel, with its center along the same central axis as the circle of input electrodes. A control knob is provided having a recess in which is attached a member; the control knob recess is fitted over the disk with one of the disk and the member being magnetized and the other being fabricated of a magnetically attracted material, whereby the control knob is held to the front of the panel by magnetic attraction. A rear surface of the control knob supports an electrode, which is rotatably alignable adjacent any one of the multiplicity of input electrodes, to affect the capacity to ground thereof.

In one preferred embodiment, the control knob is formed of a conductive plastic, whereby the body capacitance of the user causes the desired capacitance change.

In an other preferred embodiment, the control knob is formed of an insulative material and a conductive ferrule is attached to an exterior portion of the control knob, with a conductive lead connecting the ferrule and the control knob electrode, to facilitate body capacitance effects when the control knob ferrule is grasped.

In still another preferred embodiment, the knob is formed of an insulative material and the control knob electrode is of a size and shape to cause bridging between an adjacent pair of the multiplicity of input electrodes fabricated upon the opposite side of the panel, to change the bridging capacitance therebetween.

In a preferred embodiment of the present invention, a light-emitting display is formed by a plurality of light-emitting areas disposed about the major portion of the circumference of a circle having the same center as the central axis of the control and having the light emitting areas positioned at a distance therefrom to be visible, when viewed from the control-knob-bearing side of the panel, beyond the control knob periphery.

Accordingly, it is an object of the present invention to provide a novel capacitive touch control which may be utilized without providing openings through a panel to which the control is attached.

It is another object of the present invention to provide a novel capacitive touch control utilizing magnetic attraction for maintaining the control knob upon a panel.

It is still another object of the present invention to provide a novel capacitive touch control having a light-emitting display indicative of the control knob position.

These and other objects of the present invention will become apparent to those skilled in the art upon consideration of the following detailed description taken in conjunction with the drawings.

DESCRIPTION OF THE DRAWINGS

FIG. 1 is a front view of one presently preferred embodiment of a novel capacitive touch control in accordance with the principles of the present invention;

FIG. 2 is a sectional side view of the novel capacitive touch control along line 2—2 of FIG. 1;

FIG. 3 is an exploded perspective view of the novel capacitive control knob of FIG. 1;

FIG. 4 is a rear view of the control knob utilized in the touch control; and

FIG. 5 is a sectional side view of another preferred embodiment of control knob for use in the present invention.

DETAILED DESCRIPTION OF THE INVENTION

Referring now to FIGS. 1–4, a novel capacitive touch control 10 is fabricated upon the opposed surfaces 11a and 11b of a panel 11 formed of a substantially transparent and insulative material, such as glass, plastic and the like. Typically, apparatus (not shown) behind panel surface 11b carries electrical potentials and currents hazardous to the safety of personnel; the insulative panel 11 is interposed between this apparatus and such personnel, whereby the user has ready access only to the forward surface 11a of the panel. It will be appreciated that openings in panel 11, even for the purpose of allowing control knobs to protrude therethrough, is undesirable, as are actual protrusions of any conductive material from the space behind panel surface 11b into the space forward of panel surface 11a. Accordingly, panel 11 is preferably a solid and unbroken panel.

A multiplicity of conductive pads 12a–12g, for example, are positioned in spaced-apart manner each from the other and each radially extending from a common center, i.e. the center line 13 of touch control 10 (as particularly shown in FIG. 3). Each of the radially-extended electrodes 12a–12g has a separate electrical lead 14a–14g, respectively, extending therefrom to circuitry (not shown) of known type for recognizing a change in capacitance; each of leads 14a–14g is routed in such manner as to be insulated from each of the remaining leads, and may typically comprise a conductive film plated upon rear surface 11b of the substantially transparent panel. Advantageously, the leads will themselves be of a light-transmissive material, such as tin oxide or indium oxide and the like. it should be understood that, while seven electrodes 12a–12g are illustrated herein, a lesser or greater number may be equally as well utilized without departing from the concept and intent of the present invention.

A small, relatively thin disk 18 of a magnetically-attracted material, such as soft steel and the like, is cemented to the front surface 11a of the insulative sheet, with its center lying on the center line 13 of the touch control. Disk 18 has a diameter D and a thickness T, selected as hereinbelow explained.

A control knob assembly 20 comprises a radially symmetric knob 22, formed of plastic and the like materials, which may have a somewhat tapered forward portion 22a which may be manufactured with a surface having knurled, fluted or the like formations on the surface thereof for aiding manual rotation of the knob, and may have a rear portion 22b formed as a flared skirt having a diameter greater than the greatest diameter of forward portion 22a. The rear surface 22c of the knob is an essentially flat surface, substantially transverse to the axis of rotation of the knob, which axis of rotation will be positioned to coincide with the center line 13 of the touch control. A recess 24, of diameter D', and a depth S is formed into knob rear surface 22c, with its center along the center of rotation of the knob. A magnetized member 26, preferably formed into a thin cylindrical shape, is inserted into recess 24 and fastened, by suitable means, therein. It should be understood that member 26 may be molded into knob recess 24 and may be formed of a magnetically-attracted material if disk 18 is formed of a magnetized material. Advantageously, the diameter D' of the recess is slightly larger than the diameter D of disk 18 cemented to the panel front surface 11a and magnetized member 26 also advantageously has a thickness V selected such that the sum of the thicknessses of member 26 and disk 18 is slightly greater than the depth of recess 24, whereby knob rear surface 22c is maintained adjacent to, but slightly spaced from, panel forward surface 11a, when the knob recess 24 is fitted over disk 18 and the knob assembly is held to the panel by the magnetic attraction between member 26 and disk 18. Knob assembly 20 is thus rotatable about the control centerline 13.

A small conductive sheet electrode 28 is molded into the skirt portion 22b of the knob and is substantially flush with knob rear surface 23c. Sheet electrode 28 radially extends from the knob (and control) centerline for a distance sufficient to allow the sheet electrode to overlap one of electrodes 12a–12g fabricated upon the opposite surface of panel 11, when knob 20 is rotated to align electrode 28 and a particular one of electrodes 12a–12g. Advantageously, knob 22 is formed of a conductive plastic, whereby the electrical impedance to ground of the user is in electrical connection with electrode 28 and, when the user grasps the control knob, serves to change the impedance between electrical ground and that one of electrodes 12a–12g with which electrode 28 is aligned. The associated electronics (not shown) will advantageously cycle to each of electrode leads 14a–14g to determine with which of electrodes 12a–12g the knob electrode 28 is presently aligned, and will effect, in accordance with the position of the knob electrode, control of the function associated therewith.

The control knob assembly 22 may bear an appropriate index marking, typically radially disposed upon the skirt portion 22b thereof immediately over the center of electrode 28, to serve as an indication of control knob position, and utilized in conjunction with reference points, marks and/or graduations upon panel 11. In my preferred embodiment, however, a substantially circular light-bar display 40 is utilized to follow movement of the control knob assembly 20. The light-bar assembly, which may be of the gas discharge, liquid crystal or other electroluminescent type, has a multiplicity of arcuate segments 42 consecutively arranged about the periphery of a major portion of a circle, centered upon the capacitive touch control central axis, i.e., center line 13. The segments 42 have maximum and minimum radii respectively somewhat greater than, and approximately equal to, the maximum radius of the skirt portion 22b of the control knob assembly, whereby the electrically-induced luminescence (shown as lighted area 44) (FIG. 1) is visible adjacent the edge of the control knob assembly, when the user is viewing panel front surface 11a. A typical type of light-bar display 40, and the electronics required to actuate the same in multiplexed manner, may be as described in U.S. Pat. No. 4,060,801, incorporated herein by reference. Alternatively, a linear light-bar such as is shown in the aforementioned U.S. Patent, can be utilized adjacent to the capacitive touch control assembly, particularly in crowded control panel areas where control knobs are grouped with relatively small spacing therebetween, such that a circular light-bar indicator might be substantially blocked from the view of the user. Preferably, at least one reference point, such as the "LO", "MED" and "HI" markings 46a–46c (FIG. 1), will be utilized to facilitate rapid recognition by the user of adjustment range and the start and end points thereof.

The knob of the capacitive touch control is easily removed by exerting sufficient force outward from panel face 11a to overcome the magnetic attraction between magnetized member 26 and magnetically-attracted disk 18. Advantageously, the amount of removal force (and, conversely, the amount of attracted force holding the knob to the panel) can be adjusted by selection of the proper magnetized and magnetically attracted materials and the size of the member 26 and disk 18. Further, the width W of electrode 28 may be selected to be substantially equal to the width of each electrode 12a–12g with which it is to be aligned, or may be increased to provide capacitive bridging between an adjacent pair of electrodes 12a–12g, with the associated electronic circuitry being configured, in known manner, to effectuate the desired control function with the chosen form of capacitive variation. It should be understood that, if the capacitive bridging technique is to be utilized, the control knob 22 may be formed of an insulating material, as control is effectuated by the capacitance between electrode 28 and a pair of electrodes 12a–12g, rather than by body capacitance effects upon electrodes 12.

Referring now to FIG. 5, an alternate embodiment of control knob 20' includes a conductive ferrule 50 mounted upon front portion 22a of a knob fabricated of an insulative material. A conductive lead 52 is utilized to electrically connect ferrule 50 and electrode 28, if body capacity effects are to be utilized with the particular capacitive control system selected.

While several preferred embodiments of the present invention have been described, many variations and modifications will now become apparent to those skilled in the art. It is my intent, therefore, to be limited only by the scope of the appending claims, rather than by the illustrative embodiments described herein.

What is claimed is:

1. A capacitive touch control for fabrication upon a panel of insulative material, comprising:
   a multiplicity of electrodes fabricated upon a first surface of said panel, said multiplicity of electrodes being electrically isolated from one another and arranged at substantially equal distances from a common center forming a central axis of said control;

a disk fastened to a second surface, opposite said first surface, of said panel, said disk having its axis of rotation substantially aligned with said central axis;

a control knob having a rear surface, said surface having a recess formed centrally therein;

a member fastened to said control knob at the bottom of said recess; and a sheet electrode fastened to said control knob rear surface;

said disk and said member being fabricated of magnetically attractive materials, said control knob being held adjacent to said panel first surface by the magnetic attraction between said disk and said member when said disk is positioned within said recess;

said control knob being rotatable about said central axis to rotate said sheet electrode in the plane of and adjacent to said panel second surface to cause a variation in the capacitance associated with at least one of said multiplicity of electrodes upon said panel first surface.

2. The capacitive control knob of claim 1, wherein said control knob is formed of a conductive material.

3. The capacitive touch control of claim 1, wherein said control knob is formed of insulative material.

4. The capacitive touch control of claim 3, further comprising a conductive ferrule formed upon an exterior surface of at least a portion of said control knob; and means for electrically connecting said ferrule and said sheet electrode.

5. The capacitive touch control of claim 1, wherein said sheet electrode is configured to be alignable over only one of said multiplicity of electrodes at any position of rotation of said sheet electrode about said central axis.

6. The capacitive touch control of claim 1, wherein said sheet electrode is configured to overlap portions of an adjacent pair of said multiplicity of electrodes at any position of rotation of said sheet electrode about said central axis.

7. The capacitive touch control of claim 1, wherein said panel is substantially light-transmissive; said touch control further comprising a display member positioned adjacent to said first panel surface and having a multiplicity of light-emitting areas viewable through said panel for indicating the relative position of said sheet electrode with respect to at least one reference point along the rotational path of said sheet electrode.

8. The capacitive touch control of claim 7, wherein said light-emitting areas are arranged along a major portion of the circumference of a circle having its center substantially coincident with said central axis, said circle having a radius selected to cause each of said light-emitting areas, when lit, to be viewable beyond the periphery of said control knob.

9. The capacitive touch control of claim 1, wherein said control knob rear surface is substantially flat in a direction transverse to the axis of rotation of said control knob; and said control knob recess has a depth selected to cause said flat rear surface to lie adjacent to and spaced from said panel second surface, when said member and said disk abut one another.

* * * * *